United States Patent [19]
Touchy
[11] 3,725,284
[45] Apr. 3, 1973

[54] METHOD OF PRODUCING OXYGEN POOR GALLIUM ARSENIDE BY USING ALUMINUM WITH SILICON OR GERMANIUM AS A DOPANT

[75] Inventor: Wolfgang Touchy, Munich, Germany

[73] Assignee: Siemens Aktiengesellschaft, Berlin, Germany

[22] Filed: Apr. 28, 1971

[21] Appl. No.: 138,192

[30] Foreign Application Priority Data

Apr. 30, 1970 Germany....................P 20 21 345.0

[52] U.S. Cl............252/62.3 GA, 148/171, 148/172, 148/1.5, 23/301 SP

[51] Int. Cl..............................................H01l 3/20

[58] Field of Search......148/171, 172, 181, 189, 190; 252/62.3 GA; 23/301 SP

[56] References Cited

UNITED STATES PATENTS 3,560,275 2/1971 Kressel et al.........................148/171
3,278,342 10/1966 John et al.............................148/1.6

OTHER PUBLICATIONS

Kressel et al., "Luminescence in Silicon-Doped GaAs Grown by Liquid-Phase Epitaxy," J. Appl. Physics, Vol. 39, March 1968, pp. 2,006-2,011.

*Primary Examiner*—G. T. Ozaki
*Attorney*—Curt M. Avery, Arthur E. Wilfond, Herbert L. Lerner and Daniel J. Tick

[57] ABSTRACT

The invention relates to a method of producing oxygen poor gallium arsenide with silicon or germanium as a dopant. An element of the III group of the Periodic System, particularly aluminum, is added to the gallium arsenide containing melt for gettering the oxygen. The invention is particularly suited for the production of gallium arsenide, which is processed into luminescence diodes.

1 Claim, 1 Drawing Figure

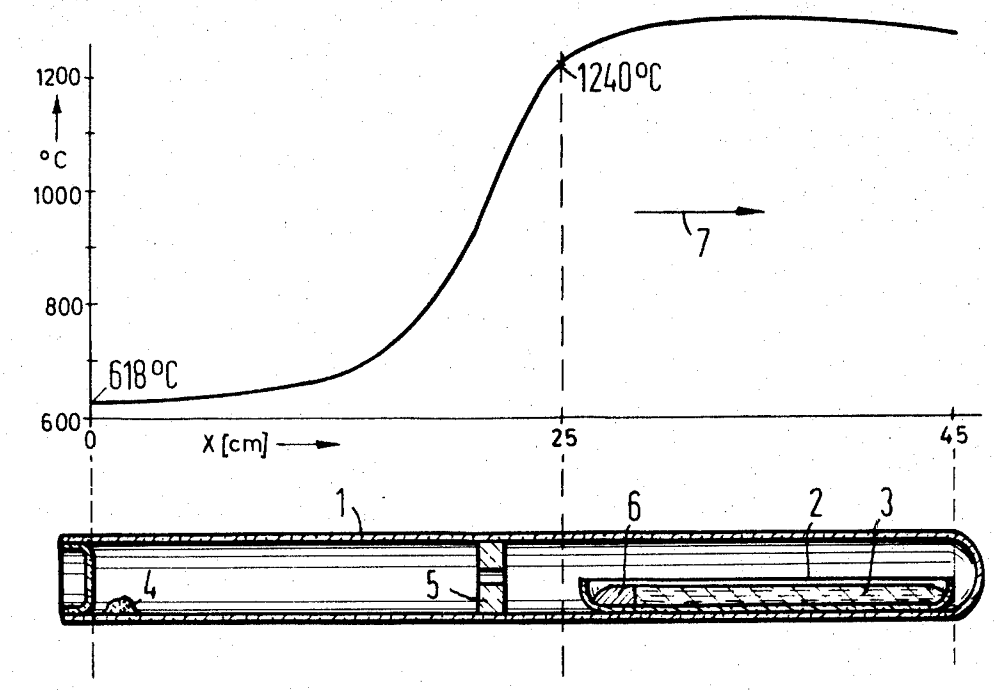
1200
°C
1000
800
600
618°C
1240°C
7
0
X [cm]
25
45
1
6
2
3
4
5

METHOD OF PRODUCING OXYGEN POOR GALLIUM ARSENIDE BY USING ALUMINUM WITH SILICON OR GERMANIUM AS A DOPANT

The invention relates to a method of producing oxygen poor or depleted, crucible or boat pulled gallium arsenide with silicon or germanium used as a dopant.

During the doping of gallium arsenide crystals using silicon or germanium as a dopant, the silicon or germanium can product p-type conductance and n-type conductance in the gallium arsenide crystal. If the gallium arsenide crystal is pulled, at a temperature below 920° C for example, from a gallium melt compound with gallium arsenide, then the crystallizing gallium arsenide will have p-type conductance. On the other hand, at temperatures above 920° C, n-type conductance occurs in the crystallizing gallium arsenide.

Doping with silicon or germanium, has the great disadvantage that the doping conditions are very hard to reproduce, although the gallium arsenide melt is compounded in a definite manner, with the dopant silicon or germanium.

I now found that these irregularities stem from oxygen traces which are easily found in gallium arsenide melts and which cannot be avoided during the production of gallium arsenide.

These oxygen traces form in the gallium arsenide, deep lying donor levels and nonradiating centers, and lead to great waste during the production of semiconductor components such as laser diodes or luminescence diodes. Apparently, the oxygen present in the gallium arsenide crystal, deposits upon the silicon or germanium atom, and thus impairs the electrical effectiveness of these dopants.

It is an object of the invention to avoid said difficulties. I achieve this by providing the gallium arsenide containing melt, prior to the crystallization of the gallium arsenide, with an element of group III of the periodic system, which element has a particularly high affinity to oxygen.

Since the oxygen can dissolve in the gallium arsenide up to $10^{19}$ atoms/cm$^3$, the amount of the element added to the gallium arsenide containing melt should be $10^{18}$ to $10^{20}$ atoms/cm$^3$.

Aluminum is best suited for the method of the invention as its ionic radius resembles that of gallium. As a result of the installation of aluminum atoms into the gallium arsenide lattice, the oxygen is bound by the aluminum which has a higher chemical affinity to this element than silicon or germanium. This causes the oxygen to become electrically ineffective and the dopant which consists of silicon or germanium, is fully effective.

Thus, the method according to the invention is particularly well suited for producing gallium arsenide, which is to be further processed into luminescence diodes.

The invention will be described in greater detail, with reference to an embodiment illustrated in the drawing.

The upper part of the FIGURE shows a graphic illustration of the temperature curve in a device shown in the lower part of the FIGURE, used for producing the boat pulled gallium arsenide. The device comprises a quartz ampule 1, which contains a quartz boat 2. According to the horizontal Bridgeman technique, a mixture 3 of gallium, arsenic, aluminum and the dopant silicon or another n-doping substance, are weighed into the quartz boat 2. The latter is placed within and sealed into the ampule 1 which contains additional arsenic 4. To avoid reactions between the arsenic and the other reaction partners, the quartz ampule 1 is provided with a separating wall 5. A gallium arsenic monocrystalline seed 6 is provided at the one end of the boat 2, to effect a monocrystalline solidification. The temperature profile is pulled through the boat 2 in the direction indicated by arrow 7, so that the temperature gradient supports the direction of the crystal growth.

I claim:

1. A method for producing oxygen poor crucible or boat pulled gallium arsenide with a dopant selected from silicon and germanium which comprises adding aluminum in an amount of $10^{18}$ to $10^{20}$ atoms/cm$^3$ to the gallium arsenide containing melt, prior to the crystallization of gallium arsenide and pulling horizontally a gallium arsenide crystal from the melt by a gallium arsenide monocrystal seed in said boat while maintaining a temperature gradient which promotes the direction of crystal growth.

* * * * *